(12) United States Patent
Yeom et al.

(10) Patent No.: US 8,974,630 B2
(45) Date of Patent: Mar. 10, 2015

(54) INDUCTIVELY COUPLED PLASMA PROCESSING APPARATUS HAVING INTERNAL LINEAR ANTENNA FOR LARGE AREA PROCESSING

(75) Inventors: Geun-Young Yeom, Seoul (KR); Young-Joon Lee, Seoul (KR); Kyong-Nam Kim, Daejeon (KR)

(73) Assignee: Sungkyunkwan University, Seoul (KR)

( * ) Notice: Subject to any disclaimer, the term of this patent is extended or adjusted under 35 U.S.C. 154(b) by 1622 days.

(21) Appl. No.: 12/332,927

(22) Filed: Dec. 11, 2008

(65) Prior Publication Data

US 2009/0173445 A1    Jul. 9, 2009

Related U.S. Application Data

(60) Continuation-in-part of application No. 11/643,664, filed on Dec. 22, 2006, now abandoned, which is a division of application No. 10/438,221, filed on May 15, 2003, now Pat. No. 7,338,577.

(30) Foreign Application Priority Data

May 7, 2003 (KR) .................................. 2003-28849

(51) Int. Cl.
*H01L 21/306* (2006.01)
*C23C 16/00* (2006.01)
*H01J 37/32* (2006.01)

(52) U.S. Cl.
CPC .................................... *H01J 37/321* (2013.01)
USPC .............. 156/345.48; 118/723 I; 118/723 AN (58) Field of Classification Search
CPC H01J 37/321; H01J 37/3211; H01J 37/32119
USPC ........ 118/723 I, 723 IR, 723 AN; 156/345.48, 156/345.49; 315/111.51
See application file for complete search history.

(56) References Cited

U.S. PATENT DOCUMENTS

| 5,464,476 A | 11/1995 | Gibb et al. |
| 5,531,834 A | 7/1996 | Ishizuka et al. |
| 5,565,738 A | 10/1996 | Samukawa et al. |
| 5,838,111 A | 11/1998 | Hayashi et al. |
| 6,000,360 A * | 12/1999 | Koshimizu ................ 118/723 E |

(Continued)

FOREIGN PATENT DOCUMENTS

| EP | 1130948 | * 9/2001 |
| JP | 09-293682 | 11/1997 |

(Continued)

*Primary Examiner* — Luz Alejandro Mulero
(74) *Attorney, Agent, or Firm* — NSIP Law (57) ABSTRACT

An inductively coupled plasma processing apparatus for a large area processing includes a reaction chamber and a bending type antenna structure. The bending type antenna structure includes bending type linear antennas. Each of the bending type linear antennas has a first end, a second end and a bended portion. The bending type linear antennas are arranged horizontally in parallel with the substrate to pass through the reaction chamber inside the reaction chamber. The bending type linear antennas are spaced apart from each other. A bended portion of a bending type linear antenna is protruded out of the reaction chamber, a first end of each of the bending type linear antennas is protruded out of the reaction chamber and is coupled to an RF power, and a second end of each of the bending type linear antennas is protruded out of the reaction chamber and is coupled to a ground.

8 Claims, 10 Drawing Sheets

(56) References Cited

U.S. PATENT DOCUMENTS

| | | |
|---|---|---|
| 6,071,372 A | 6/2000 | Ye et al. |
| 6,181,069 B1 * | 1/2001 | Tonotani et al. ......... 315/111.51 |
| 6,341,574 B1 | 1/2002 | Bailey, III et al. |
| 6,534,922 B2 | 3/2003 | Bhardwaj et al. |
| 2003/0168172 A1 | 9/2003 | Glukhoy |

FOREIGN PATENT DOCUMENTS

| | | |
|---|---|---|
| JP | 11-087096 | 3/1999 |
| JP | 2000-208298 | 7/2000 |
| KR | 1999-080959 | 11/1999 |
| KR | 2000-0053680 | 9/2000 |
| KR | 1020010030355 | 4/2001 |

* cited by examiner

INDUCTIVELY COUPLED PLASMA PROCESSING APPARATUS HAVING INTERNAL LINEAR ANTENNA FOR LARGE AREA PROCESSING

This application is continuation of application Ser. No. 11/643,664 filed Dec. 22, 2006 now abandoned, which is a division of application Ser. No. 10/438,221, filed on May 15, 2003, now U.S. Pat. No. 7,338,577, which claims the benefit of Korean Application No. 2003-28849 filed on May 7, 2003, in the Korean Intellectual Property Office, the entire disclosures of which are incorporated herein by reference for all purposes.

BACKGROUND

1. Technical Field

The present invention relates to an inductively coupled plasma processing apparatus, and more particularly to an inductively coupled plasma processing apparatus, in which a linear antenna creating an electric field is accommodated in a reaction chamber for carrying out a plasma etching process over a large area.

2. Description of the Related Art

Generally, an inductively coupled plasma (ICP) processing apparatus includes a spiral type antenna, which is installed at an upper outer portion of a reaction chamber by interposing dielectric material between the spiral type antenna and the reaction chamber performing a plasma etching process. When induced radio frequency power is applied to the spiral type antenna, an electric field is created in the reaction chamber, thereby generating plasma in the reaction chamber. The ICP processing apparatus has a simple structure as compared with structures of ECR (Electron cyclotron resonance) and HWEP (Helicon-wave excited plasma) processing devices, so the ICP processing apparatus can generate plasma over a large area with a relatively simple manner, so that the ICP processing apparatus is widely used and developed.

Figure 1A:
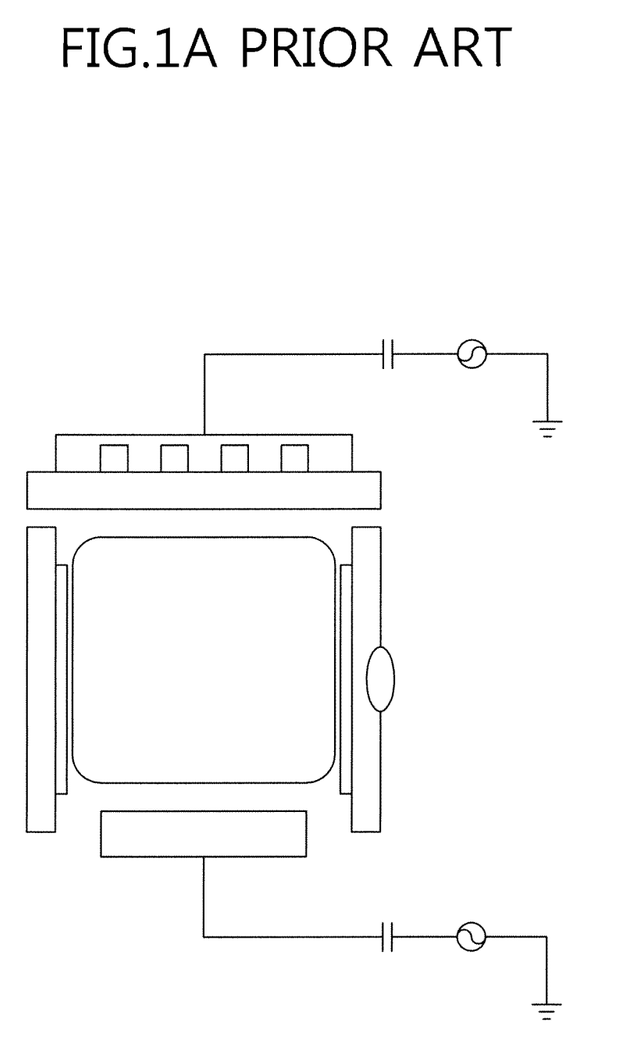
FIGS. 1A and 1B are schematic views showing a conventional ICP processing apparatus and an antenna source, respectively.
Figure 1B:
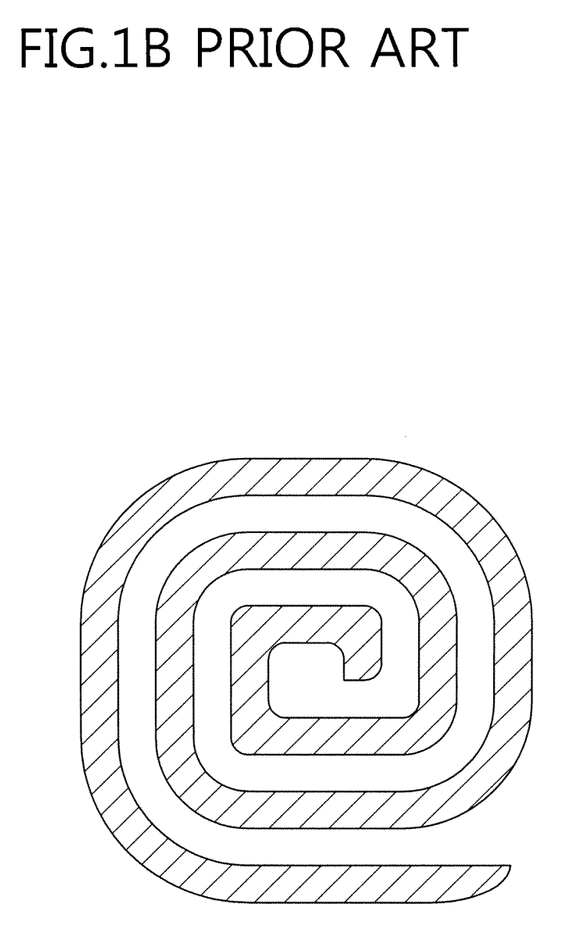

A spiral type ICP source has been widely used as an antenna source for obtaining high-efficiency and high-density plasma. FIG. 1A is a schematic view showing a conventional ICP chamber. An antenna source is positioned at an uppermost part of the ICP chamber such that it is exposed to an exterior. In addition, dielectric material is positioned between the ICP chamber and the antenna source so as to insulate the antenna source from the ICP chamber while maintaining a vacuum state. FIG. 1B is a view showing a shape of a spiral type antenna source used in the ICP chamber. However, the spiral type antenna source causes problems as the size of the ICP chamber is enlarged. Firstly, size and thickness of dielectric material, which maintains the vacuum state between the antenna source and the ICP chamber, are increased as the ICP chamber is enlarged, thereby increasing the manufacturing cost. In addition, since a distance between the antenna source and plasma is remote from each other, plasma efficiency is lowered. Moreover, a length of the antenna source is correspondingly increased as the ICP chamber is enlarged, so power loss is caused due to resistance of the antenna source and an evenness of the spiral type antenna source is created. In addition, if a power supply applying RF power of 13.56 MHz to the ICP chamber is used, a standing wave effect occurs in a source corresponding to a half wavelength of 13.56 MHz.

SUMMARY

The present invention has been made to solve the above problems of the conventional ICP processing apparatus, therefore, it is a feature of the present invention to provide an ICP processing apparatus having internal linear antenna, which can be applied to a chamber having a large area and can prevent a standing wave effect, which is a sort of an interference phenomenon caused when a total length of a source matches with a half wavelength value of an RF power such as 13.56 MHz. In this case, a traveling wave is interfered with a reflecting wave, so the wave seems to be stopped without moving any directions.

To achieve the feature of the present invention, there is provided an inductively coupled plasma processing apparatus for a large area processing, the inductively coupled plasma processing apparatus including: a reaction chamber in which a substrate is loaded a bending type antenna structure including a plurality of bending type linear antennas, each of the bending type linear antennas having a first end, a second end and a bended portion, the bending type linear antennas being arranged horizontally in parallel with the substrate to pass through the reaction chamber inside the reaction chamber, the bending type linear antennas being spaced apart from each other, wherein a bended portion of a bending type linear antenna is protruded out of the reaction chamber, a first end of each of the bending type linear antennas is protruded out of the reaction chamber and is coupled to an RF power, and a second end of each of the bending type linear antennas is protruded out of the reaction chamber and is coupled to a ground. The first end of each of the bending type linear antennas may be protruded out of a first side of the reaction chamber, the second end of each of the bending type linear antennas may be protruded out of the first side of the reaction chamber, and the bended portion of each of the bending type linear antennas may be protruded out of a second side of the reaction chamber. The bending type antenna structure may include first, second, third and fourth bending type linear antennas, the first and fourth bending type linear antennas may have the same size each other, and the second and third bending type linear antennas, which are positioned between the first and fourth bending type linear antennas, may have the same size each other. The linear antennas may be surrounded by antenna protecting tubes made of quartz. The linear antennas may be fabricated by using any one selected from the group consisting of copper, stainless steel and aluminum. At least one magnet may be positioned adjacent to the bending type linear antennas so as to create a magnetic field substantially perpendicularly crossing an electric field created by the bending type linear antennas, and the at least one magnet may be arranged horizontally in parallel with the substrate to pass through the reaction chamber inside the reaction chamber. The magnet may have a linear shape corresponding to a shape of the linear antennas. A plurality of magnets may be provided in such a manner that adjacent two magnets have poles different from each other. The magnet may be surrounded by a magnet protecting tube made of quartz.

According to another embodiment of the present invention, there is provided an inductively coupled plasma processing apparatus for a large area processing, the inductively coupled plasma processing apparatus comprising: a reaction chamber; a plurality of linear antennas horizontally and linearly arranged at an inner upper portion of the reaction chamber while being spaced from each other by a predetermined distance for receiving induced RF power, the linear antennas including a plurality of first linear antennas and second linear antennas arranged between the first linear antennas, first ends of the first linear antennas being protruded out of the reaction chamber and coupled to each other so as to be connected to a first induced RF power section, first ends of the second linear antennas being protruded out of the reaction chamber in opposition to the first ends of the first linear antennas and coupled to each other so as to be connected to a second induced RF power section; and at least one magnet positioned adjacent to the linear antennas for creating a magnetic field perpendicularly crossing an electric field created by the linear antennas in such a manner that electrons perform a spiral movement.

Second ends of the first and second linear antennas, which are opposite to the first ends of the first and second linear antennas, may be grounded. The linear antennas may be surrounded by antenna protecting tubes made of quartz. The linear antennas may be fabricated by using any one selected from the group consisting of copper, stainless steel and aluminum.

The magnet may include a plurality of magnets, which are horizontally positioned between adjacent linear antennas while being spaced from each other. The magnet may have a linear shape corresponding to a shape of the linear antennas. The magnets may be provided in such a manner that adjacent two magnets have poles different from each other. The magnets may be surrounded by magnet protecting tubes made of quartz.

BRIEF DESCRIPTION OF THE DRAWINGS

The above object and other advantages of the present invention will become more apparent by describing in detail preferred embodiments thereof with reference to the attached drawings in which.

DETAILED DESCRIPTION

Hereinafter, example embodiments of the present invention will be described in detail with reference to accompanying drawings. The example embodiments described below will not limit the scope of the present invention, but show examples of the present invention.

Figure 2:
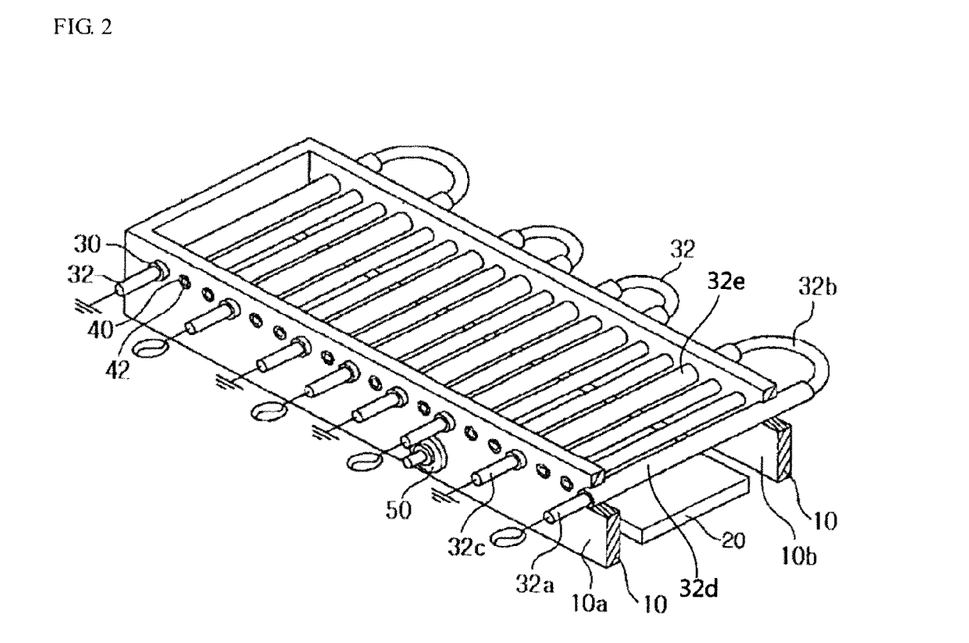
FIG. 2 is a schematic perspective view of an internal linear antenna according to one embodiment of the present invention.

FIG. 2 is a schematic perspective view of bending type internal linear antennas according to one example embodiment of the present invention. Referring to FIG. 2, a stage 20 is installed at a lower portion of a reaction chamber 10 in order to place a substrate (not shown) thereon in such a manner that a plasma etching process or a deposition process is carried out with respect to the substrate. Preferably, the stage 20 moves up and down and can be formed as an electrostatic chuck.

An exhaust line connected to a vacuum pump (not shown) is formed at a bottom wall or at a part of a sidewall of the reaction chamber 10.

A bias power section is connected to the stage 20 in order to apply bias power to the stage 20. In addition, a bias voltage-measuring device (not shown) is installed on the stage 20 in order to measure bias voltage.

An inner upper portion of the reaction chamber 10 is a plasma source region, in which a plurality of linear antennas 32 are arranged horizontally in parallel with the substrate to pass through the reaction chamber 10 inside the reaction chamber 10. The linear antennas are spaced apart from each other. The linear antennas 32 are linearly aligned in the reaction chamber 10. However, the linear antennas 32 are bent at an external portion of the reaction chamber 10 and connected to each other in series. Each of the linear antennas 32 has a first end 32a, a second end 32c and a bended portion 32b. A bended portion 32b of the linear antenna 32 is protruded out of the reaction chamber 10. A first end 32a of each of the linear antennas 32 is protruded out of the reaction chamber 10 and is coupled to an induced RF power. A second end 32c of each of the linear antennas 32 is protruded out of the reaction chamber 10 and is coupled to a ground.

For example, as shown in FIG. 2, in case the linear antennas 32 include first, second, third and fourth bending type linear antennas, the first end 32a of each of the four bending type linear antennas is protruded out of a first side 10a of the reaction chamber 10 to be coupled to an RF power, the second end 32c of each of the four bending type linear antennas is protruded out of the first side 10a of the reaction chamber 10 to be coupled to a ground, and the bended portion 32b of each of the four bending type linear antennas is protruded out of a second side 10b of the reaction chamber 10.

In alternative example embodiment of the present invention, in case the linear antennas include first, second, third and fourth bending type linear antennas, bended portions of the first and third bending type linear antennas are protruded out of the second side 10b of the reaction chamber 10, bended portions of the second and fourth bending type linear antennas are protruded out of the first side 10a of the reaction chamber 10, the first and second ends of the first and third bending type linear antennas are protruded out of the first side 10a of the reaction chamber 10, and the first and second ends of the second and fourth bending type linear antennas are protruded out of the second side 10a of the reaction chamber 10.

Permanent magnets 42 are arranged adjacent to the linear antennas 32. Permanent magnet 42 may be horizontally arranged in parallel with the substrate between the linear antennas 32 to pass through the reaction chamber 10 inside the reaction chamber 10. The permanent magnets 42 are surrounded by magnet protecting tubes 40, which are made of maternal having superior resistance against a sputtering process, such as quartz. A Langmuir probe 50 is installed below the linear antennas 32. The Langmuir probe 50 is protruded from a sidewall of the reaction chamber 10.

According to the present embodiment, the reaction chamber 10 has a hexahedral shape and four linear antennas 32 are accommodated in the reaction chamber 10. Each linear antenna 32 is inserted into an antenna protecting tube 30, 32d, 32e in the reaction chamber 10. The antenna protecting tube 30, 32d, 32e is made of material having superior resistance against the sputtering process, such as quartz. The linear antenna 32 is made of copper. One end of the linear antenna 32 is grounded and the other end of the linear antenna 32 is connected to an induced RF power section 60 for achieving an induced power discharge. Selectively, the linear antenna 32 can be fabricated by using stainless steel, silver, or aluminum.

The Langmuir probe 50 is available from Hiden Analytical Inc. of Great Britain. The Langmuir probe 50 measures plasma characteristic such as plasma density and plasma uniformity from the IPC processing apparatus having internal linear antennas 32 according to the present invention. Argon gas is used for monitoring the plasma characteristics. The Langmuir probe 50 is installed downwardly remote from the linear antenna 32 by a predetermined distance.

In addition, since an N-pole and an S-pole of permanent magnets 42 installed adjacent to the linear antennas 32 are alternately arranged, a direction of magnetic filed created by magnetic lines positioned between the permanent magnets 42 is substantially perpendicularly crossing the electric field, so electrons spirally moves in the magnetic field and the electric field. That is, a moving route of electrons is enlarged through the magnetic field and the electric field, so that a collision probability between neutrons and electrons is increased. As the collision probability between neutrons and electrons is increased due to the electrons spirally moved in the magnetic field and electric field, ion density is increased and electron mobility is lowered, thereby reducing an electron loss.

The linear antennas 32, for example, may include four loops. Hereinafter, loops represents bending type linear antennas 32. First and fourth loops have the same size with each other and second and third loops, which are positioned between first and fourth loops, have the same size with each other to achieve plasma uniformity. Plasma density and uniformity are changed depending on the size of the loops, so user can adjust plasma density and uniformity by varying the size of the loops. That is, it is possible to improve plasma uniformity and plasma density when the linear antennas are utilized in a super-large area plasma chamber by adjusting the size or the number of loops. In addition, one end of each loop is connected to a matching box to receive power from the matching box and the other end of each loop is grounded to the reaction chamber 10. A length of one loop is less than 3 m when it is mounted on the reaction chamber having a size of 1,020 mm·times·920 mm, thereby preventing the standing wave effect.

Figure 3:
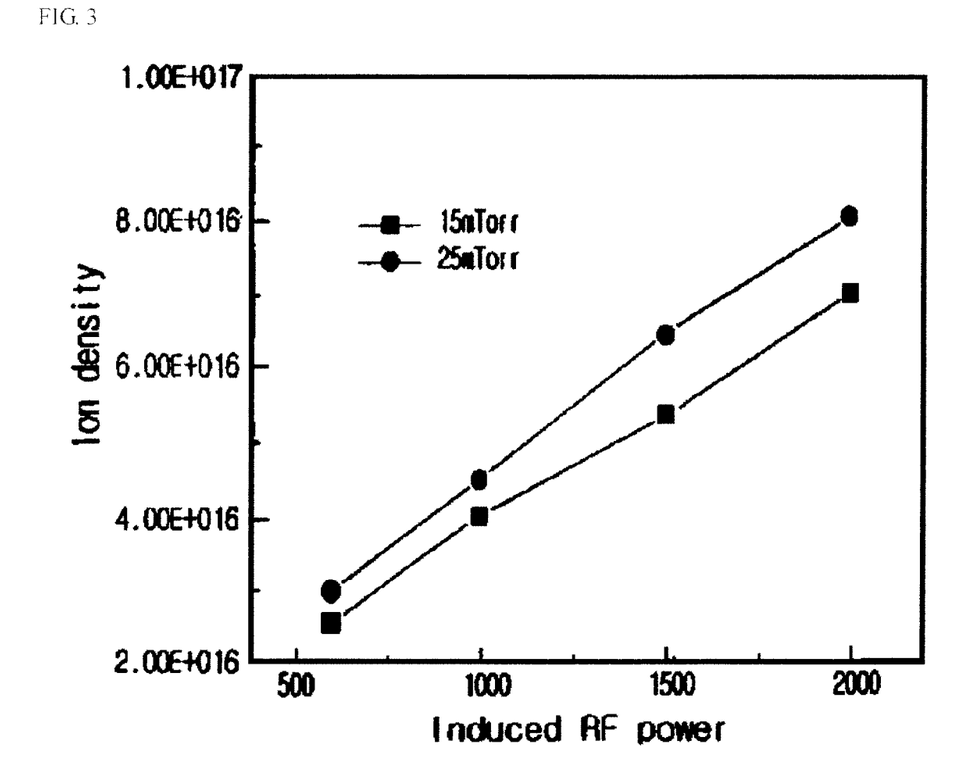
FIG. 3 is a graph showing plasma density as a function of RF power according to one embodiment of the present invention.

FIG. 3 is a graph showing plasma density as a function of RF power according to the present invention. As shown in FIG. 3, high-density plasma about 8.00E+016/m3 can be obtained under process pressure 25 mTorr and input power 2000 W.

Figure 4A:
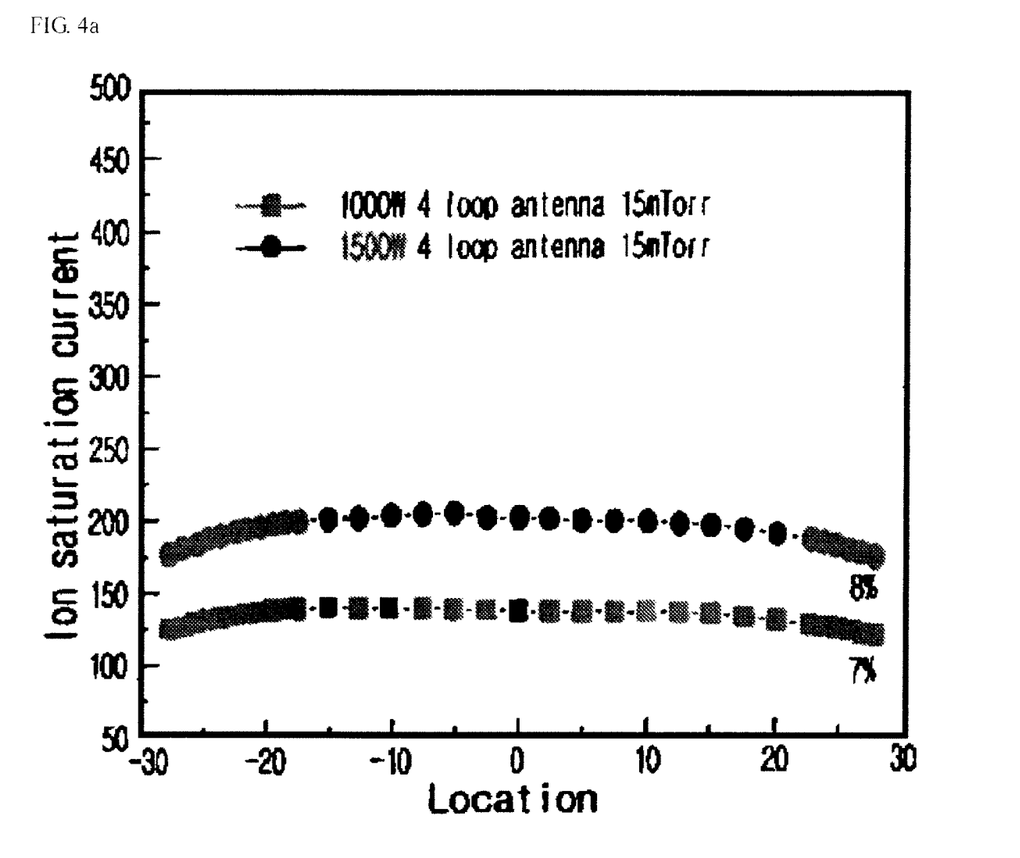
FIG. 4a is a graph showing plasma uniformity when RF power is applied to linear antennas according to one embodiment of the present invention.
Figure 4B:
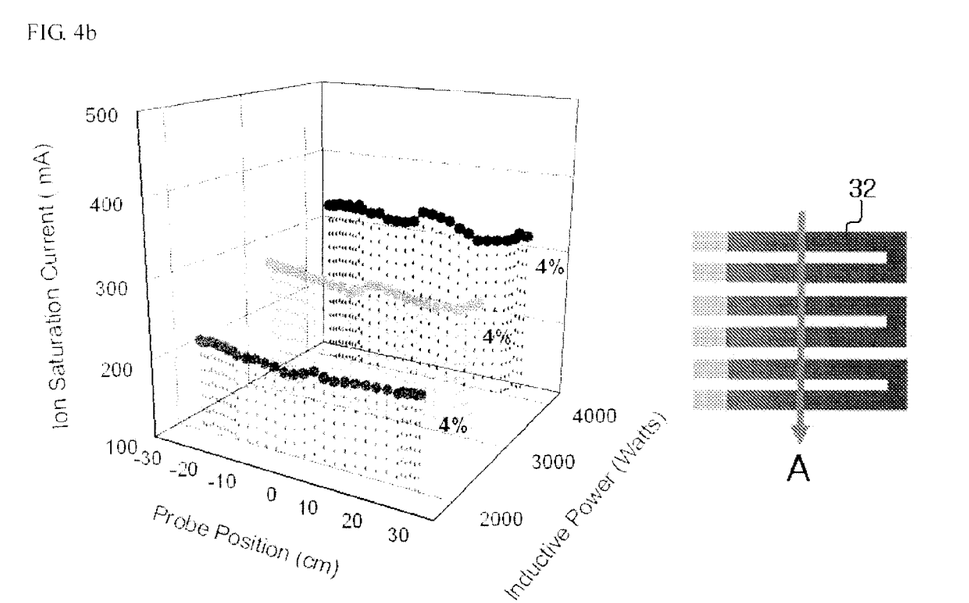
FIG. 4b is a graph showing plasma uniformity of a perpendicular direction 'A' along the linear antenna according to one example embodiment of the present invention when a magnetic field is not applied.
Figure 4C:
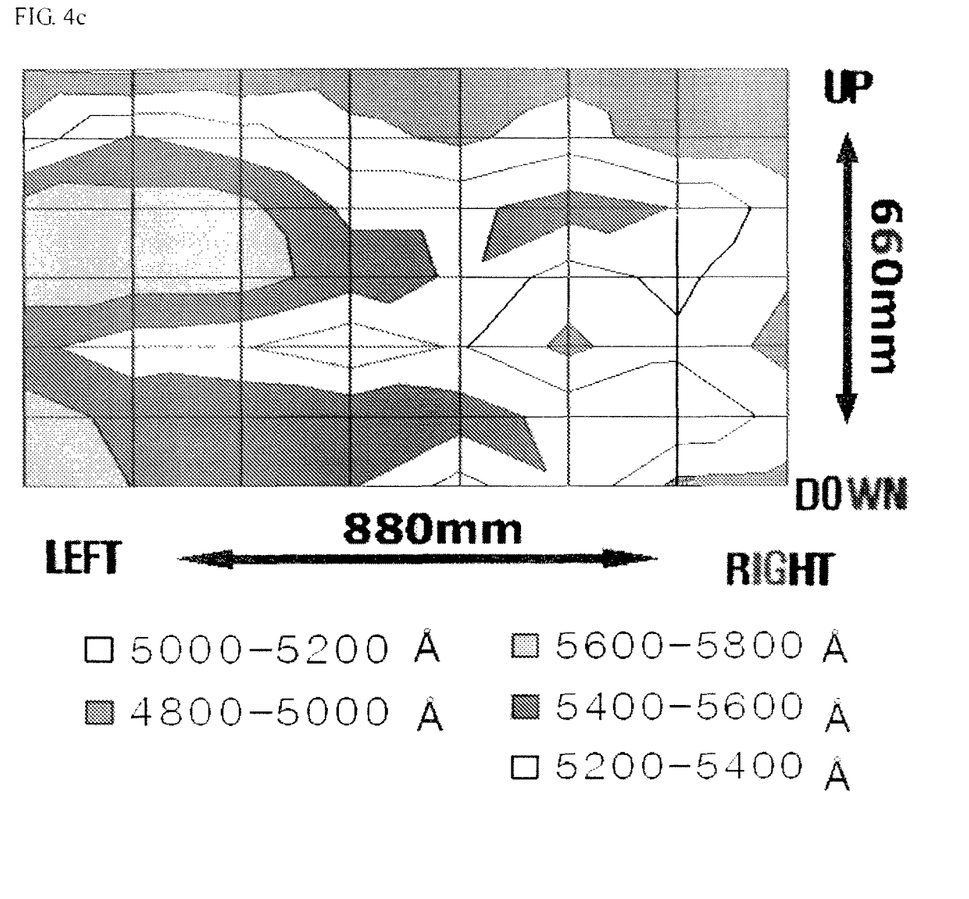
FIG. 4c is a graph showing the etch rate of photoresist using O2 plasma when a magnetic field is not applied.

FIG. 4a is a graph showing plasma uniformity when RF power is applied to linear antennas according to one example embodiment of the present invention. As shown in FIG. 4a, plasma uniformity is an important factor for forming plasma over a large area. In case of the linear antenna 32, plasma uniformity is represented as 7-8%, which is obtained by measuring ion saturation current using the Langmuir probe. FIG. 4b is a graph showing plasma uniformity of a perpendicular direction 'A' along the linear antenna according to one example embodiment of the present invention when a magnetic field is not applied. In FIG. 4b, the operation pressure is 15 mTorr of Ar gas, and the plasma ununiformity was obtained by measuring ion saturation current using the Langmuir probe at 7.5 cm below the linear antenna 32. The plasma ununiformity of perpendicular direction 'A' was less as 4% for all of the RF power conditions used in the experiment. FIG. 4c is a graph showing the etch rate of photoresist using O2 plasma when a magnetic field is not applied. The operation condition of the experiment in FIG. 4c is such that the operation pressure is 15 mTorr of O2 gas, power is 5000 Watt, RF frequency is about 13.56 MHz, bias voltage of the substrate is −100 voltage. As shown in FIG. 4c, there are five regions respectively having the etch rate between 5000~5200 Å/min, 5200~5400 Å/min, 5400~5600 Å/min, and 5600~5800 Å/min. Thus, the ununiformity of the etch rate within the substrate was less than 8%. Therefore, the inductively coupled plasma apparatus without the magnet can also provide satisfactory uniformity of plasma, and can be applied to a chamber having a large area.

Figure 5:
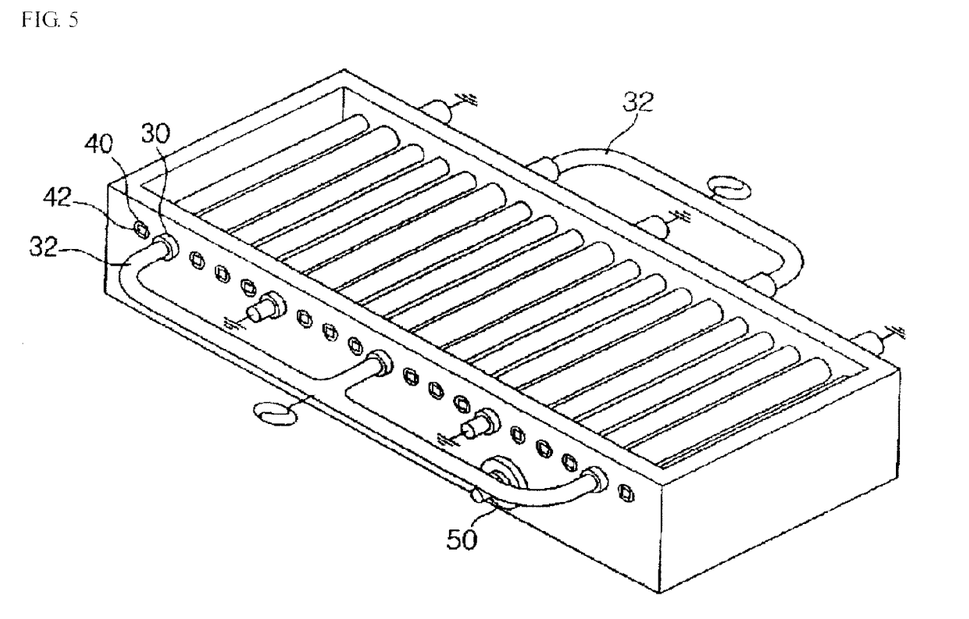
FIG. 5 is a schematic perspective view of an internal linear antenna according to another embodiment of the present invention.

FIG. 5 is a schematic perspective view of an internal linear antenna according to another embodiment of the present invention. Referring to FIG. 5, some of loops protruded out of the reaction chamber 10 are selected. The selected loops are remote from each other. Then, first ends of the selected loops are coupled to each other in the vicinity of a first sidewall region of the reaction chamber 10 and connected to the induced RF power section for achieving the induced power discharge. Second ends of the loops, which are opposite to the first ends, are grounded in the vicinity of a second sidewall region of the reaction chamber 10. In the following description, the above structure is called "comb type double antenna".

In addition, first ends of non-selected loops are coupled to each other in the vicinity of the second sidewall region of the reaction chamber 10, at which the selected loops are grounded and second ends of non-selected loops are grounded in the vicinity of the first sidewall region of the reaction chamber 10, at which the selected loops are coupled to each other.

Thus, two different comb type antennas receive RF power in one matching box so as to discharge plasma. As shown in FIG. 5, five loops are grounded. In addition, RF power passes through a path having a length about 1.5 m, which is corresponding to a transverse length of the reaction chamber 10, so the antenna source can completely remove the standing wave effect. The antenna source can effectively utilized for discharging plasma even if it is used in a super-large area plasma discharging process.

Figure 6:
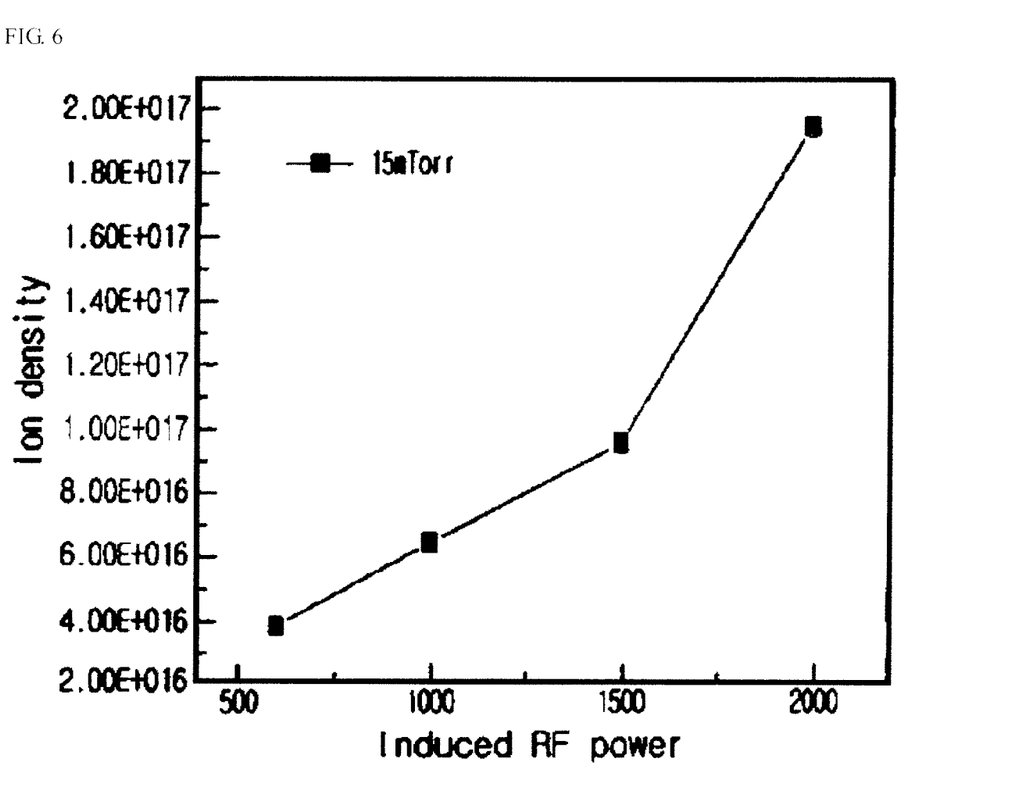
FIG. 6 is a graph showing plasma density as a function of RF power applied to linear antennas according to another embodiment of the present invention.

FIG. 6 is a graph showing plasma density as a function of RF power applied to linear antennas according to another embodiment of the present invention. As shown in FIG. 6, plasma density is represented as 1.90E+017/m3 when RF power of 2000 W is applied. As is understood from FIG. 6, plasma is stably generated when high-RF power is applied. Therefore, when plasma is discharged in a next-generation super-large area plasma processing chamber by applying high-RF power, the antenna source of the present invention can stably generate plasma.

In addition, the antenna source achieves high-plasma density even if relatively low RF power is applied thereto, so it acts as a high-efficiency plasma source.

Figure 7:
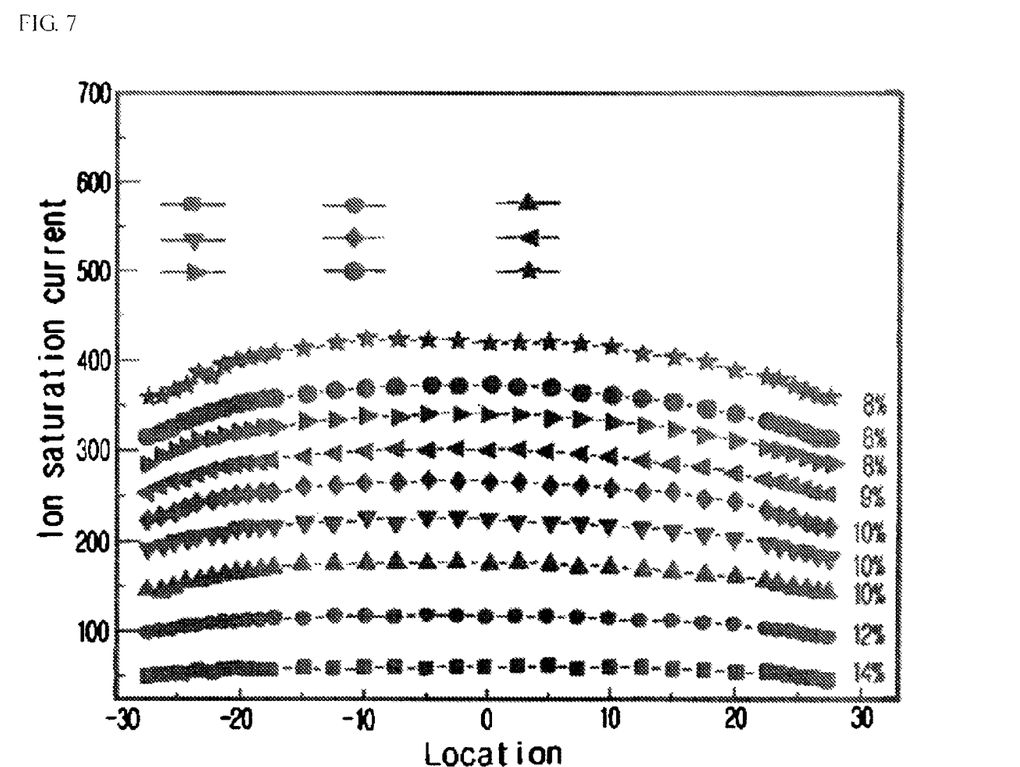
FIG. 7 is a graph showing uniformity of a plasma discharging area according to another embodiment of the present invention.

FIG. 7 is a graph showing uniformity of a plasma discharging area according to another embodiment of the present invention. As shown in FIG. 7, uniformity of the plasma discharging area is represented to 8% and 14% as RF power is changed from 600 W to 500 W.

In the applicant's experiment, the antenna sources are installed in equidistance. However, when the antenna sources are installed in the super-large area reaction chamber, a distance between the antenna sources can be adjusted so as to control uniformity of plasma. In addition, it is possible to achieve super-large area plasma source by varying the number of antenna sources while maintaining the comb-type structure.

The comb-type linear antenna 32 of the present embodiment can effectively remove the standing wave effect by shortening a length of an RF power path.

As described above, the ICP processing apparatus of the present invention has internal linear antennas coupled to permanent magnets for performing a large area plasma process, so an electric field is perpendicularly coupled to a magnetic filed in a plasma creating area in a reaction chamber. Accordingly, electrons can spirally move in the electric and magnetic fields, so a moving route of electrons can be increased. Thus, a collision probability between neutrons and electrons can be increased. In addition, plasma density is improved and an electron temperature is lowered as RF power is increased. Furthermore, plasma uniformity can be maintained within 10% when performing the super-large area plasma process while stably generating plasma.

While the present invention has been described in detail with reference to the preferred embodiments thereof, it should be understood to those skilled in the art that various changes, substitutions and alterations can be made hereto without departing from the scope of the invention as defined by the appended claims.

What is claimed is:

1. An inductively coupled plasma processing apparatus for a large area processing, the inductively coupled plasma processing apparatus comprising:

a reaction chamber in which a substrate is loaded; and a bending type antenna structure including a plurality of bending type linear antennas, each of the bending type linear antennas including a first linear portion, a second linear portion and a bended portion, the bending type linear antennas being arranged horizontally in parallel with the substrate to pass through the reaction chamber inside the reaction chamber, and the bending type linear antennas being spaced apart from each other, wherein the first and second linear portions of each of the bending type linear antennas are placed inside the reaction chamber, the first linear portion of each of the bending type linear antennas is surrounded by a first protecting tube, the second linear portion of each of the bending type linear antennas is surrounded by a second protecting tube, all of first ends of the bending type linear antennas are protruded out of a first side of the reaction chamber and are coupled to a radio frequency power, all of second ends of the bending type linear antennas are protruded out of the first side of the reaction chamber and are coupled to a ground, and the bended portion of each of the bending type linear antennas is protruded out of a second side of the reaction chamber, and wherein each of the first ends and each of the second ends of the bending type linear antennas are alternatively arranged with respect to one another such that a first end of one of the bending type linear antennas is arranged adjacent to a second end of another of the bending type linear antennas that is adjacent to the one of the bending type linear antennas.

2. The inductively coupled plasma processing apparatus as claimed in claim 1, wherein the bending type antenna structure includes first, second, third and fourth bending type linear antennas, the first and fourth bending type linear antennas have the same size, and the second and third bending type linear antennas, which are positioned between the first and fourth bending type linear antennas, have the same size.

3. The inductively coupled plasma processing apparatus as claimed in claim 1, wherein the first and second protecting tubes are made of quartz.

4. The inductively coupled plasma processing apparatus as claimed in claim 1, wherein the linear antennas are fabricated by using any one selected from the group consisting of copper, stainless steel and aluminum.

5. The inductively coupled plasma processing apparatus as claimed in claim 1, wherein at least one magnet is positioned adjacent to the bending type linear antennas so as to create a magnetic field substantially perpendicularly crossing an electric field created by the bending type linear antennas, and the at least one magnet is arranged horizontally in parallel with the substrate to pass through the reaction chamber inside the reaction chamber.

6. The inductively coupled plasma processing apparatus as claimed in claim 5, wherein the at least one magnet has a linear shape corresponding to a shape of the linear antennas.

7. The inductively coupled plasma processing apparatus as claimed in claim 6, wherein the at least one magnet is surrounded by a magnet protecting tube made of quartz.

8. The inductively coupled plasma processing apparatus as claimed in claim 1, wherein a plurality of magnets are provided in such a manner that adjacent two magnets have poles different from each other.

* * * * *